United States Patent
Terasaka

[11] Patent Number: 5,770,305
[45] Date of Patent: Jun. 23, 1998

[54] ANISOTROPIC CONDUCTIVE FILM

[75] Inventor: Shinji Terasaka, Tokyo, Japan

[73] Assignee: NEC Corporation, Japan

[21] Appl. No.: 534,445

[22] Filed: Sep. 27, 1995

[30] Foreign Application Priority Data

Sep. 30, 1994 [JP] Japan .................................. 6-236547

[51] Int. Cl.$^6$ ................................ B32B 5/16; H01B 1/22
[52] U.S. Cl. ...................... 428/328; 428/327; 428/407; 428/413; 428/901; 252/518.1; 252/519.33; 523/204; 524/413; 524/435; 524/437
[58] Field of Search ................................ 428/212, 327, 428/328, 407, 413, 901; 252/512, 514, 518, 519, 520, 518.1, 519.33; 523/204, 220; 524/413, 435, 437, 439, 440, 441

[56] References Cited

U.S. PATENT DOCUMENTS

| | | | |
|---|---|---|---|
| 5,120,665 | 6/1992 | Tsukagoshi et al. | 437/8 |
| 5,183,969 | 2/1993 | Odashima | 174/88 R |
| 5,346,558 | 9/1994 | Mathias | 148/23 |
| 5,502,889 | 4/1996 | Casson et al. | 29/830 |

FOREIGN PATENT DOCUMENTS

| | | |
|---|---|---|
| 62-80912 | 4/1987 | Japan . |
| 62-290078 | 12/1987 | Japan . |
| 1-315906 | 12/1989 | Japan . |

*Primary Examiner*—Marie Yamnitzky
*Attorney, Agent, or Firm*—Hayes, Soloway, Hennessey, Grossman & Hage, P.C.

[57] ABSTRACT

In an anisotropic conductive film, ultraresilient alloy particles, playing the role of conductive particles, are dispersed in a resin. With this configuration, the ACF reduces line defects to occur on a liquid crystal display panel and attributable thereto to one-tenth.

6 Claims, 2 Drawing Sheets

ANISOTROPIC CONDUCTIVE FILM

BACKGROUND OF THE INVENTION

The present invention relates to an anisotropic conductive film (ACF) for electrically connecting a number of fine terminals and, more particularly to an ACF for electrically connecting the terminals of a liquid crystal display (LCD).

Miniature and high-performance electronic equipments need fine and dense wiring implementations for connecting the terminals of circuit boards. ACFs available today are one of such wiring implementations and play the role of connecting members. An ACF consists of a thermoplastic resin, and particles of metal, graphite or similar conductive material dispersed in the resin in an adequate amount. After the ACF has been positioned between two portions to be connected, heat and pressure are applied to cause the ACF to adhere the two portions together. At this instant, the conductive particles are brought into contact with each other and set up conduction in the direction in which the pressure acts. At the same time, the resin hardens and adheres the two portions. In the direction perpendicular to the above direction, the conductive particles sparingly contact each other, so that electrical insulation is maintained.

With the above characteristic, ACFs are advantageously applicable to, e.g., the terminals of high-density printed circuit boards which are difficult to solder, and dot matrix type display panels having a great number of fine terminals or lands to which groups of leads must be connected at a time.

However, conventional ACFs have some problems yet to be solved, as follows. When ambient conditions, including temperature and humidity, change, gaps are produced between the connection terminals and the conductive particles of the ACF due to a difference in the coefficient of thermal expansion between the resin, contributing to adhesion, and the particles. The gaps prevent the ACF from maintaining the electrical connection.

Further, when an insulating film is accidentally formed on the surface of the terminal, the conductive particles cannot break it at the time of thermo-compression. The insulating film, therefore, obstructs the electrical connection. To eliminate this problem, the conductive particles may be implemented as hard plastic beads whose surfaces are plated with metal. This, however, brings about another problem that the beads must be bonded by an extremely adhesive resin because the beads practically looses its righting force when smashed to pieces. Another problem is that because an extremely adhesive resin is difficult to tear off, even the connection terminals are apt to come off when the residue of the resin is removed from the terminals at the time of repair.

Moreover, when use is made of a tubular fastener made of an ultraresilient alloy, it increases the number of parts and needs extra steps for production and attachment.

SUMMARY OF THE INVENTION

It is, therefore, an object of the present invention to provide a reliable ACF.

It is another object of the present invention to provide an ACF obviating extra parts and extra steps.

It is another object of the present invention to provide an ACF applicable to an LCD and capable of eliminating line defects to occur on the display due to defective connection.

In accordance with the present invention, an ACF has an adhesive insulating resin having conductivity only in the thicknesswise direction, and for linking, when compressed, electronic parts to each other to thereby electrically connect them together, and conductive particles dispersed in the resin. The conductive particles are implemented by ultraresilient alloy particles.

Also, in accordance with the present invention, an ACF has an adhesive insulating resin having conductivity only in the thicknesswise direction, and for linking, when compressed, electronic parts to each other to thereby electrically connect them together, and conductive particles dispersed in the resin. The conductive particles are implemented by ultraresilient alloy particles, and plastic particles plated with metal. The ultraresilient alloy particles and plastic particles are dispersed in the resin.

BRIEF DESCRIPTION OF THE DRAWINGS

The above and other objects, features and advantages of the present invention will become more apparent from the following detailed description taken with the accompanying drawings in which.

In the figures, the same or similar constituent parts are designated by the same reference numerals.

DESCRIPTION OF THE PREFERRED EMBODIMENTS

To better understand the present invention, a brief reference will be made to a conventional ACF, shown in FIG. 1. As shown, the ACF, generally 10, has a body 12 formed of an epoxy resin and for adhering electrodes to each other. Conductive particles 14 are dispersed in the body or resin 12 and implemented by In—Pb. The In—Pb particles 14 set up electrical connection between the electrodes. In—Pb may be replaced with Ni particles or plastic beads whose surfaces are plated with Au or similar metal, as has been customary in the art.

Figure 2:
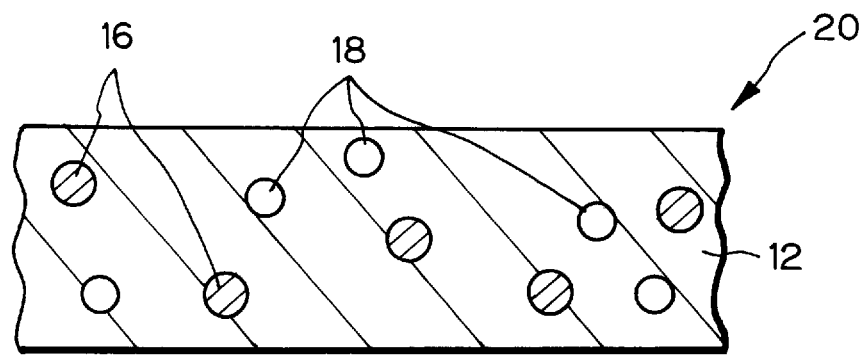

FIG. 2 shows another conventional ACF which is of the type taught in Japanese Patent Laid-Open Publication Nos. 62-80912 and 1-315906. As shown, the ACF, generally 20, has a body or resin 12 in which Ni particles 16 and an insulating resin 18 are dispersed. The insulating resin 18 has a smaller particle size than the Ni particles 16.

Figure 3:
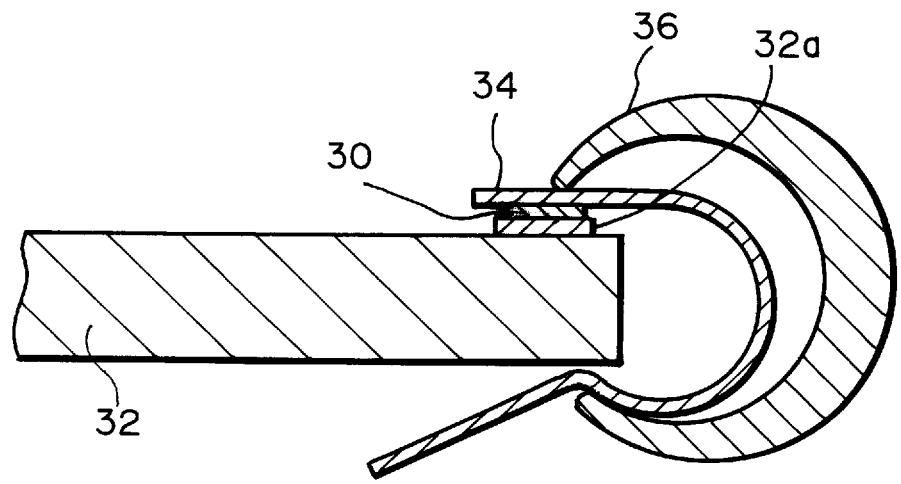
FIG. 3 is a section showing a specific conventional arrangement for connecting an ACF and electrodes.

FIG. 3 shows a conventional arrangement including an ACF 30 and disclosed in Japanese Patent Laid-Open Publication No. 62-290078. As shown, an LCD panel 32 has a panel electrode portion 32a. A tubular fastener 36 is made of an ultraresilient alloy and is formed with a slit. The fastener 36 nips a portion where the panel electrode 32a and an electrode 34 are connected to each other. In this condition, the pressure acting on the ACF 30 is maintained constant.

Figure 1:
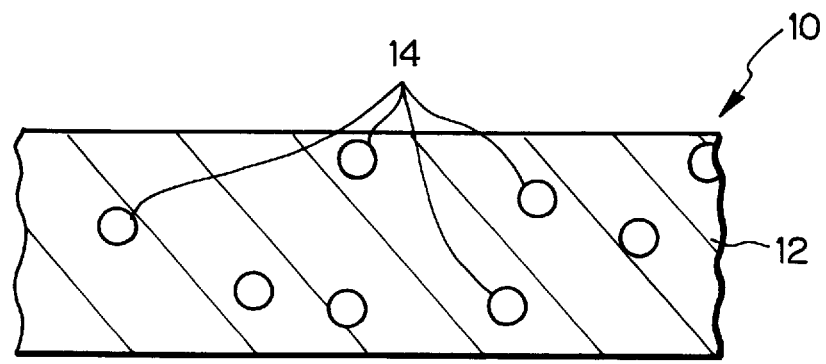
FIGS. 1 and 2 are fragmentary sections each showing a particular conventional ACF.

The conventional configurations shown in FIGS. 1–3 have various problems as discussed earlier.

Figure 4:
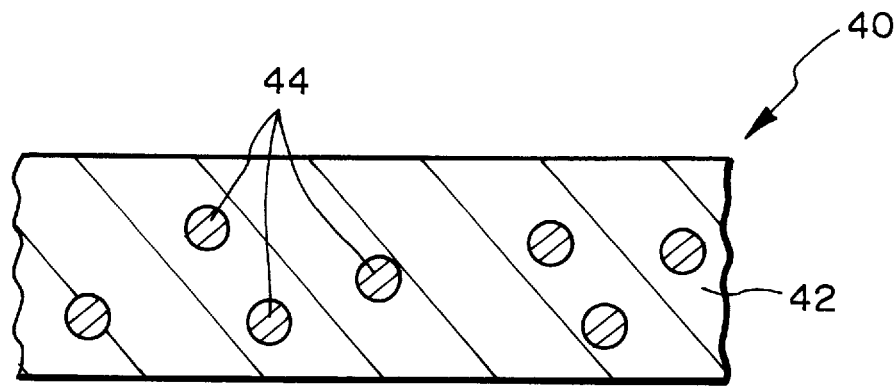
FIG. 4 is a fragmentary section of an ACF embodying the present invention.

Referring to FIG. 4, an ACF embodying the present invention is shown and generally designated by the reference numeral 40. As shown, the ACF 40 has a body 42 formed of an epoxy resin and contributing to adhesion. Conductive particles 44 are dispersed in the body or resin 42 and contribute to electrical connection. The particles 44 are made of a Ti—Ni, Cu—Zn, Cu[\M]Al or similar ultraresilient alloy. An ultraresilient alloy has a broader range of resiliency than the other alloys and expands or contracts in response to a change in stress. The particles 44, crushed by thermo-compression, remains in a compressed state due to a stress acting thereon from the outside.

Assume that the resin 42 of the ACF 40 expands due to a change in temperature and/or humidity, pushing connection terminals, not shown, upward. As a result, the stress acting between the particles 44 and the connection terminals i s reduced. This causes the particles 44 to expand due to its righting force and thereby maintains the electrical contact of the particles 44 with the connection terminals. In the illustrative embodiment, the particles 44 have a mean particle size of 8 μm and has a content of 1 wt % in the resin 42.

Figure 5:
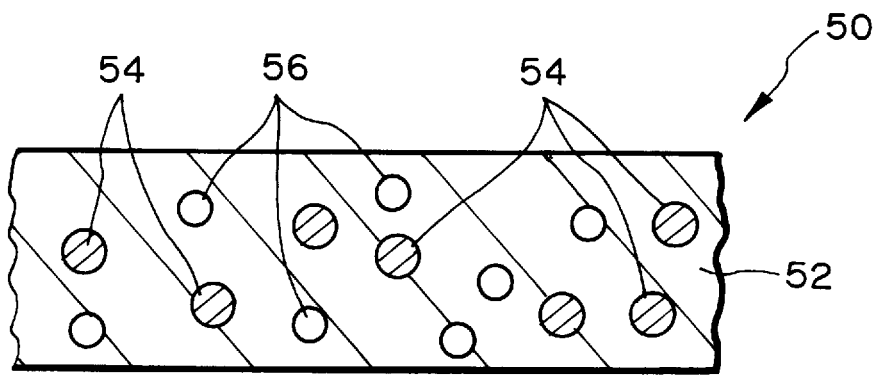
FIG. 5 is a fragmentary section showing an alternative embodiment of the present invention.
Figure 6:
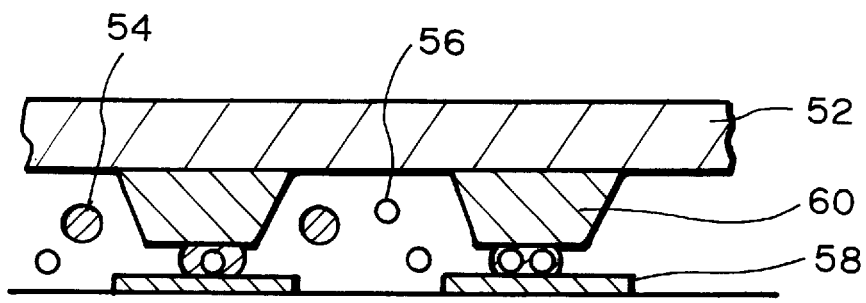
FIG. 6 is a fragmentary section of a connecting section undergone thermo-compression using the alternative embodiment.

FIG. 5 shows an alternative embodiment of the present invention. As shown, an ACF 50 has a body or resin 52 in which ultraresilient alloy particles, or conductive particles, 54 and plastic particles 56 plated with metal are dispersed. FIG. 6 shows a specific connecting section connected by thermo-compression using the ACF 50. Assume that at the time of repair an insulating film is accidentally formed on connection terminals 58 provided on an LCD panel due to the residue of the resin 52, silicone oil, etc. Then, the plastic particles 56 plated with metal and hard break the insulating film at the time of thermo-compression. The ultraresilient alloy particles 54 contact the plastic particles 56 from above the particles 56. As a result, the terminals 58 of the display panel are surely electrically connected to terminal portions 60 included in a TCP (Tape Carrier Package). In the illustrative embodiment, the alloy particles 54 have a mean particle size of 8 μm while the plated plastic particles 56 have a mean particle size of 5 μm, and each has a content of 3 wt % in the resin 52. The plastic particles 56 have their surfaces plated with about 0.5 μm thick Au.

The embodiment shown in FIG. 4 is desirable when the surfaces of connection terminals are clean. The embodiment shown in FIG. 5 is advantageously applicable to connection terminals on which insulating films or the like are deposited at the time of repair or similar occasion.

In summary, it will be seen that the present invention provides a reliable ACF capable of reducing line defects to occur on an LCD panel and attributable to an ACF to one-tenth. While TCPs with line defects have heretofore been replaced and discarded, the decrease in line defect achievable with the invention reduces the amount of TCPs to be discarded to one-tenth and thereby reduces the material cost. These unprecedented advantages are derived from ultraresilient alloy particles dispersed in a resin.

Various modifications will become possible for those skilled in the art after receiving the teachings of the present disclosure without departing from the scope thereof.

What is claimed is:

1. An anisoptropic conductive film having conductivity only in a thicknesswise direction comprising an adhesive insulating resin comprising a dispersed mixture of insulating resin and conductive particles for linking, when compressed, electronic parts to each other to thereby electrically connect said electronic parts, said conductive particles comprising elastically deformable alloy particles which expand or contract in response to a change in stress, wherein said elastically deformable alloy particles comprise Ti—Ni alloy particles.

2. An anisoptropic conductive film having conductivity only in a thicknesswise direction comprising an adhesive insulating resin comprising a dispersed mixture of insulating resin and conductive particles for linking, when compressed, electronic parts to each other to thereby electrically connect said electronic parts, said conductive particles consisting essentially of elastically deformable alloy particles which expand or contract in response to a change in stress, wherein said elastically deformable alloy particles consist essentially of Cu—Zn alloy particles.

3. An anisoptropic conductive film having conductivity only in a thicknesswise direction comprising an adhesive insulating resin comprising a dispersed mixture of insulating resin and conductive particles for linking, when compressed, electronic parts to each other to thereby electrically connect said electronic parts, said conductive particles consisting essentially of elastically deformable alloy particles which expand or contract in response to a change in stress, wherein said elastically deformable alloy particles consist essentially of Cu—Al alloy particles.

4. An anisoptropic conductive film having conductivity only in a thicknesswise direction comprising an adhesive insulating resin comprising a dispersed mixture of insulating resin and conductive particles for linking, when compressed, electronic parts to each other to thereby electrically connect said electronic parts, said conductive particles comprising elastically deformable alloy particles which expand or contract in response to a change in stress, wherein said resin comprises an epoxy resin.

5. An anisoptropic conductive film having conductivity only in a thicknesswise direction comprising an adhesive insulating resin comprising a dispersed mixture of insulating resin and conductive particles for linking, when compressed, electronic parts to each other to thereby electrically connect said electronic parts, said conductive particles comprising elastically deformable alloy particles which expand or contract in response to a change in stress, wherein said conductive particles have a mean particle size of 8 μm and a content of one weight percent in said film.

6. An anisotropic conductive film having conductivity only in a thicknesswise direction comprising:
   an adhesive insulating resin for linking, when compressed, electronic parts to each other and
   conductive particles dispersed in said resin to thereby electrically connect said electronic parts;
   said conductive particles comprising elastically deformable alloy particles which expand or contract in response to a change in stress, and plastic particles plated with metal, said elastically deformable alloy particles and said plastic particles being dispersed in said resin, and where said elastically deformable alloy particles have a mean particle size of 8 μm and a content of 3 wt % in said film wherein said plastic particles coated with metal have a mean particle size of 5 μm and a content of 3 wt % in said film, said metal coating comprising Au and having a thickness of 0.5 μm.

* * * * *